United States Patent
Heid et al.

(10) Patent No.: US 6,842,003 B2
(45) Date of Patent: Jan. 11, 2005

(54) RADIO-FREQUENCY ANTENNA FOR A MAGNETIC RESONANCE SYSTEM

(75) Inventors: Oliver Heid, Gunzenhausen (DE); Markus Vester, Nuremberg (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/394,925

(22) Filed: Mar. 21, 2003

(65) Prior Publication Data

US 2003/0184298 A1 Oct. 2, 2003

(30) Foreign Application Priority Data

Mar. 26, 2002 (DE) .......................................... 102 13 565

(51) Int. Cl.[7] .............................................. G01V 3/00
(52) U.S. Cl. ...................................... 324/318; 324/322
(58) Field of Search ................................. 324/318–322; 333/219; 343/900

(56) References Cited

U.S. PATENT DOCUMENTS

| | | | | |
|---|---|---|---|---|
| 5,003,265 A | * | 3/1991 | Leussler | 324/318 |
| 5,144,239 A | * | 9/1992 | Oppelt et al. | 324/318 |
| 5,216,368 A | * | 6/1993 | Leussler | 324/318 |
| 5,416,413 A | * | 5/1995 | Leussler | 324/318 |
| 5,585,721 A | * | 12/1996 | Datsikas | 324/318 |
| 6,043,658 A | * | 3/2000 | Leussler | 324/318 |
| 6,633,161 B1 | * | 10/2003 | Vaughan, Jr. | 324/318 |
| 2003/0146750 A1 | * | 8/2003 | Vaughan, Jr. | 324/318 |
| 2003/0184298 A1 | * | 10/2003 | Heid et al. | 324/318 |
| 2003/0222832 A1 | * | 12/2003 | Greim | 343/900 |

FOREIGN PATENT DOCUMENTS

| | | | |
|---|---|---|---|
| DE | 0 342 745 A2 | * | 11/1989 |
| DE | 197 02 256 | | 7/1998 |
| EP | 1 085 337 | | 3/2001 |
| EP | 1 085 337 A2 | * | 3/2001 |

OTHER PUBLICATIONS

The Bandpass Birdcage Resonator Modified as a Coil Array for Simultaneous MR Acquisition—Leussler et al—ISMRM p. 196.

* cited by examiner

*Primary Examiner*—Diego Gutierrez
*Assistant Examiner*—Tiffany A. Fetzner
(74) *Attorney, Agent, or Firm*—Schiff Hardin LLP

(57) ABSTRACT

A radio-frequency antenna has two end rings and a number of antenna rods that form a birdcage resonator. A coupling element couples high-frequency electromagnetic energy into the resonator in the transmission mode and out therefrom in the reception mode. The coupling element is fashioned as a conductor system tangentially surrounding the resonator and into which a high-frequency systems of currents can be fed in the transmission mode or from which a high-frequency system of currents can be fed out in the reception case. The coupling element is coupled only inductively to the resonator.

24 Claims, 3 Drawing Sheets

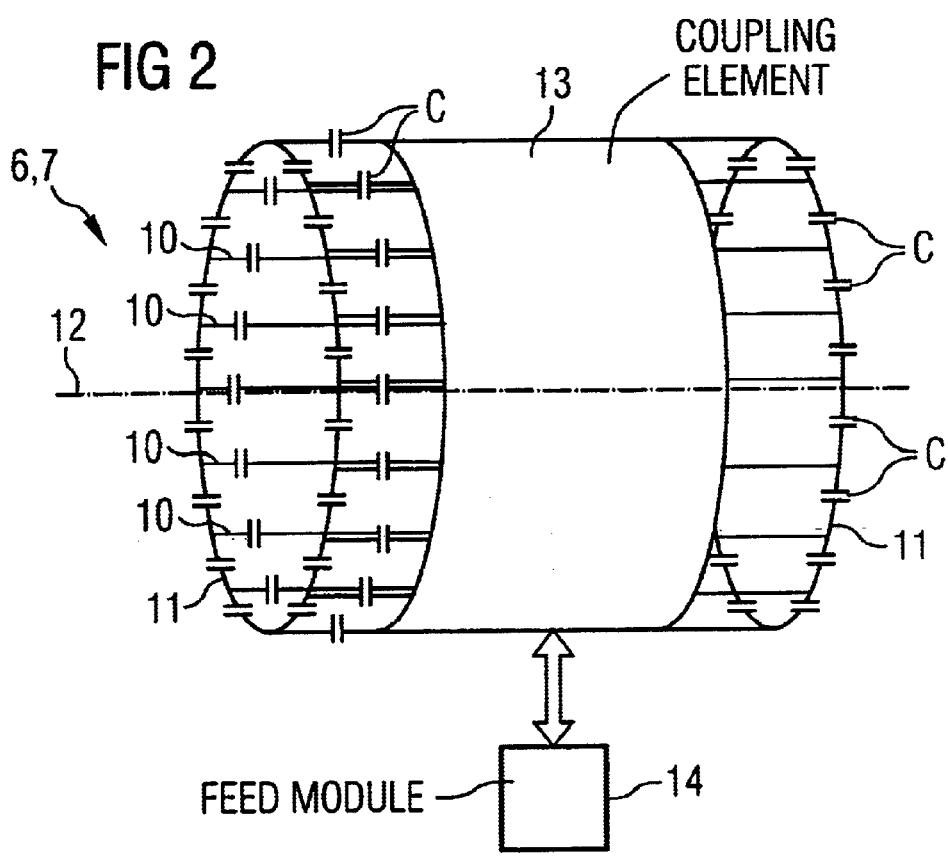
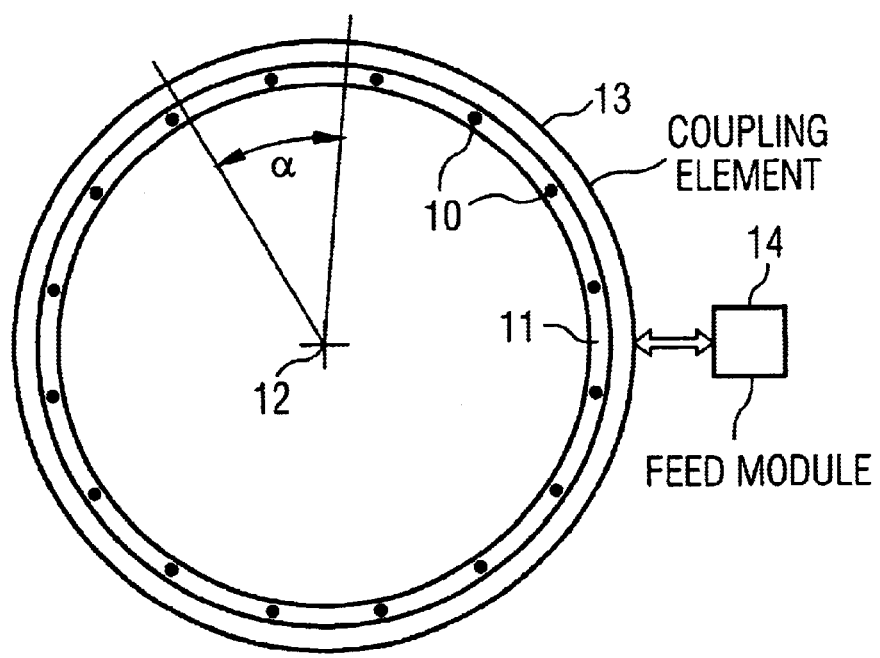

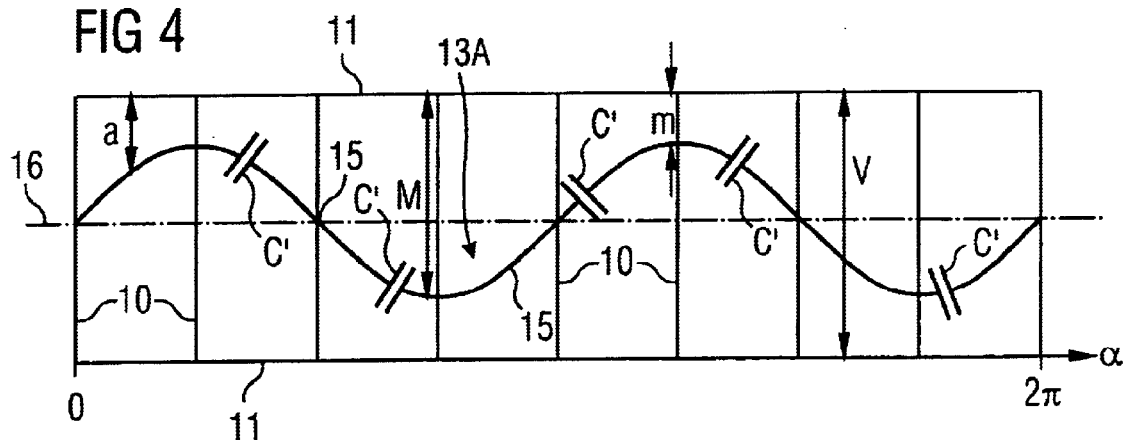
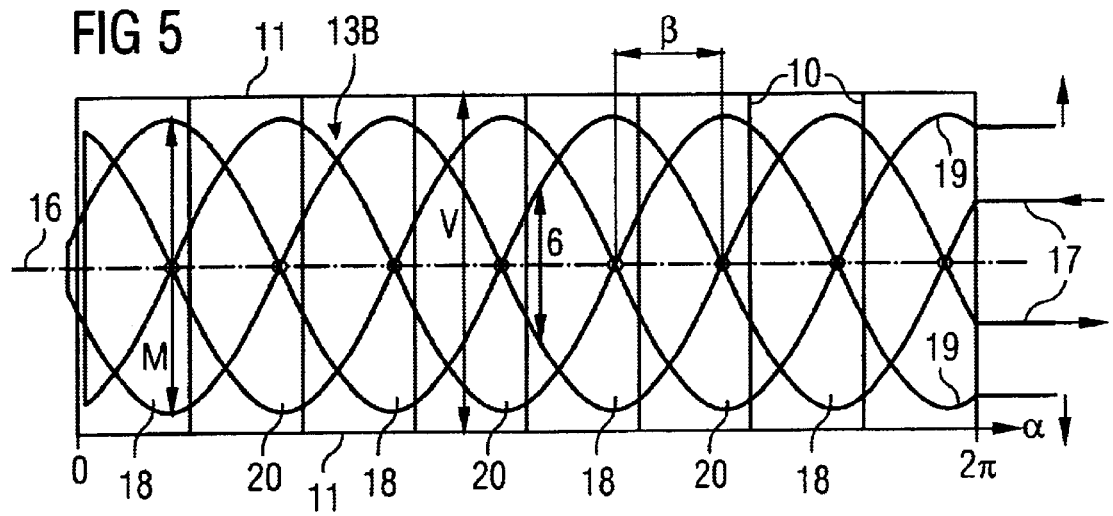
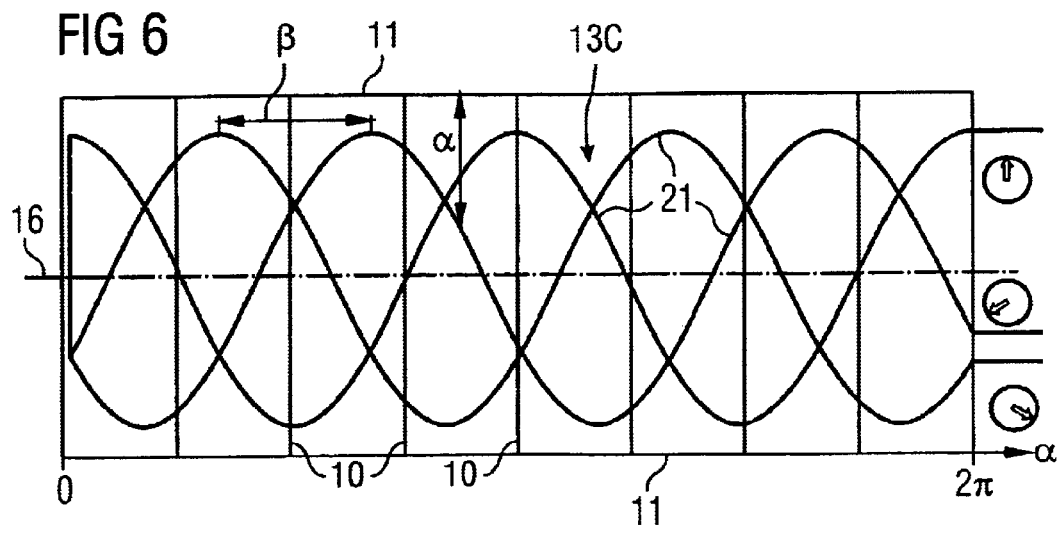

RADIO-FREQUENCY ANTENNA FOR A MAGNETIC RESONANCE SYSTEM

BACKGROUND OF THE INVENTION

1. Field of the Invention

The present invention is directed to a radio-frequency antenna for a magnetic resonance system, of the type having two end rings and a number of antenna rods, wherein the end rings are arranged concentrically around an antenna axis and are axially offset relative to one another and the antenna rods connect the end rings to one another, and wherein a coupling element can couple radio-frequency electromagnetic energy into the end rings and into the antenna rods in the transmission mode and can couple radio-frequency electromagnetic energy out therefrom in the reception mode.

2. Description of the Prior Art

Radio-frequency antennas of this type are known as birdcage resonators. As a rule, the antenna rods therein are arranged parallel to the antenna axis.

Birdcage resonators have a number of oscillatory modes, each of which can have its own resonant frequency. It is generally advantageous in magnetic resonance applications to tune the individual oscillatory modes to the same resonant frequency. This can be achieved by means of suitable tuning measures that are described, for example, by Christoph Leussler, Jaro Stimma and Peter Röschmann in their conference paper, "The Bandpass Birdcage Resonator Modified as a Coil Array for Simultaneous MR Acquisition", ISMRM 1997, page 176.

Due to this tuning to the same resonant frequency (namely, the Larmor frequency), mode separation is no longer possible by means of frequency-dependent impedances, neither in the transmission mode nor in the reception mode.

SUMMARY OF THE INVENTION

An object of the present invention is to provide a coupling element in an antenna of the above type with which only predefined modes can always be excited, regardless of whether the resonant frequencies of the individual oscillatory modes are the same or differ from one another.

The object is achieved in accordance with the invention wherein the coupling element is designed as conductor system tangentially surrounding the antenna axis in the region of the antenna rods and into which a radio-frequency system of current can be fed by a feed module in the transmission mode and from which a radio-frequency system of current can be fed in the reception mode, and that is only inductively coupled to the end rings and to the antenna rods.

This allows the geometrical design of the coupling element to determine which mode is excited, or which modes are excited.

The coupling element can be formed by a conductor system. A minimal configuration of such a conductor system has a single conductor that proceeds around the antenna axis and that has a spacing from one of the end rings that varies with a tangential angle. In this case, however, the coupling element generates a relatively large magnetic field parallel to the antenna axis. Conductor systems having more than one conductor are therefore preferred.

A compensation of the magnetic field components in the direction of the antenna axis can be achieved, for example, in an embodiment wherein the conductor system has a basic conductor group with two conductors, the conductors proceed around the antenna axis, cross at crossing tangential angles and having a spacing from one another therebetween, so that the conductors form an even number of windows, and currents that are electrically phase-offset by 180° are fed into the conductors in the transmission mode or currents electrically phase-offset by 180° are fed out of the conductors in the reception mode.

A high excitation efficiency is already achieved with this configuration. Which modes are excited is dependent on the specific design of the conductors.

In this embodiment, the excited mode is, or the excited modes are, linearly polarized. Circularly polarized modes are preferred in a further version of the embodiment, however, for magnetic resonance applications. In order to achieve this, the conductor system has an auxiliary conductor group, the auxiliary conductor group being fashioned just like the basic conductor group but its windows being staggered compared to those of the basic conductor group, currents that are electrically phase-offset by 180° are fed into the conductors of the auxiliary conductor group in the transmission mode or currents electrically phase-offset by 180° are fed out therefrom in the reception mode, and the currents flowing in the conductors of the auxiliary conductor group are electrically phase-offset by 90° compared to the currents flowing in the conductors of the basic conductor group.

In this version, four conductors are required for achieving a circularly polarizing excitation. The number of conductors can be reduced to three in a version wherein the conductor system has a number of conductors that, except for an offset angle, proceed identically periodically around the antenna axis, so that the conductors have spacings from one of the end rings that vary with a tangential angle, the product of the offset angle with the number of conductors and the number of periods of a conductor yields 360°, currents that are electrically phase-offset are fed into the conductors in the transmission mode or currents that are electrically phase-offset are fed out of the conductors in the reception mode, and the product of the phase angle with the number of conductors yields 360°.

A particularly simple structure is achieved in an embodiment wherein the conductors are short-circuited with each other at respective ends of respective paths of the conductors around the antenna axis.

In an embodiment wherein the conductor is or the conductors are symmetrically arranged relative to a middle plane that perpendicularly intersects the antenna axis in the middle between the end rings, lower capacitive couplings occur.

In an embodiment wherein shortening capacitors are arranged in the conductor or in the conductors, the conductor system can be utilized despite high excitation frequencies and relatively long conductors.

In an embodiment wherein the spacing of the conductor from the end ring or the spacings of the conductors from one another or from the end ring, depends or depend essentially sinusoidally on the tangential angle, only one mode is basically excited.

In an embodiment wherein the spacing of the conductor from the end ring or the spacings of the conductors from one another or from the end ring, assumes or assume a maximum value and a minimum value and the difference between maximum value and minimum value amounts to at least 30%, preferably 50 through 90%, of the offset of the end rings relative to one another, then an especially high excitation efficiency is achieved.

DESCRIPTION OF THE DRAWINGS

FIG. 2 shows a radio-frequency antenna according to the invention in a perspective view.

FIG. 3 shows the radio-frequency antenna of FIG. 2 viewed along the antenna axis.

FIGS. 4–6 show the radio-frequency antenna of FIG. 2 in an uncoiled illustration with various embodiments of the conductor system of the coupling element.

DESCRIPTION OF THE PREFERRED EMBODIMENTS

Figure 1:
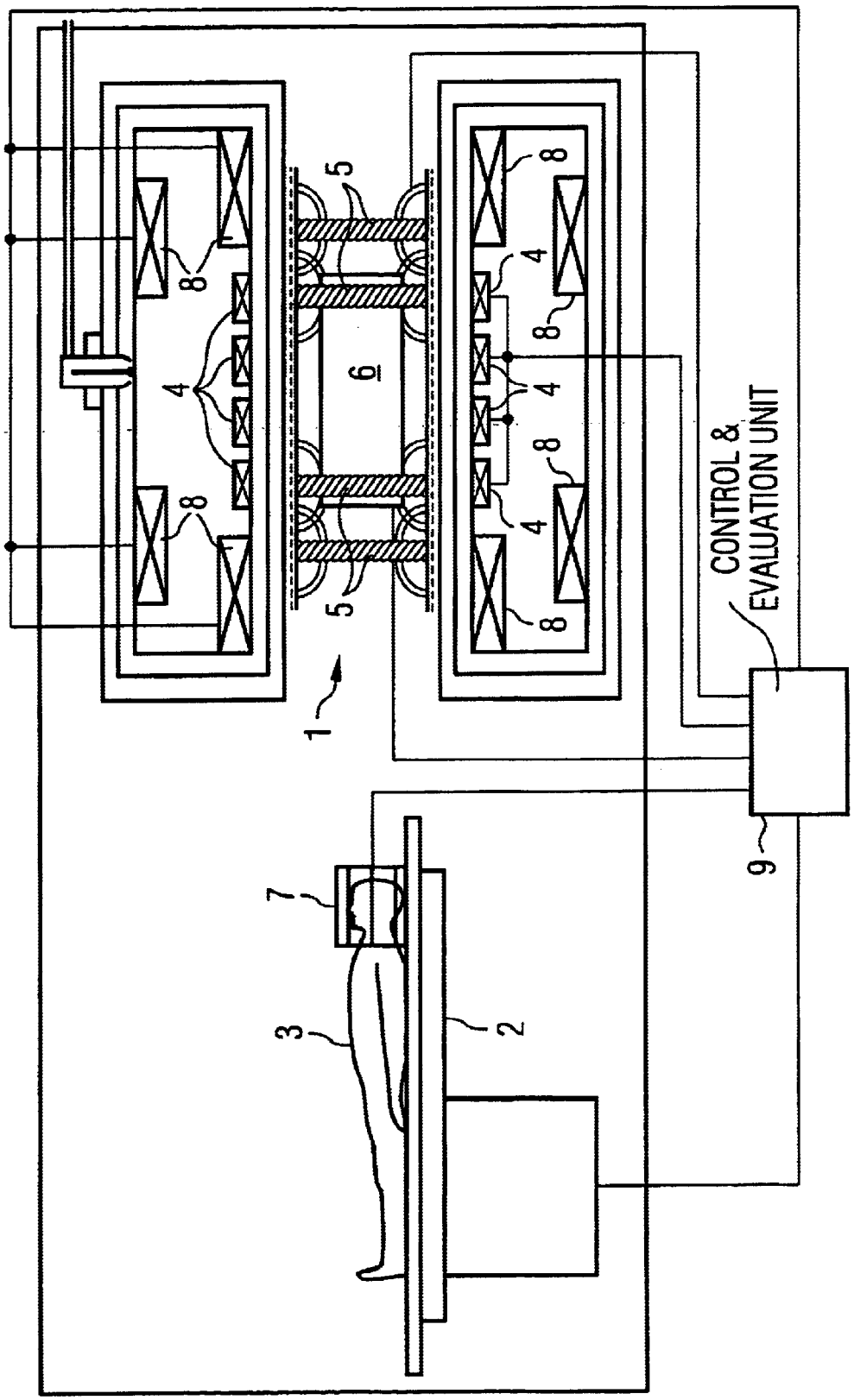
FIG. 1 schematically illustrates the basic components of a magnetic resonance, system in which the inventive radio-frequency antenna can be employed.

The magnetic resonance system shown in FIG. 1 has an examination space 1. A patient 3 (in general: an examination subject 3) can be introduced into the examination space 1 with a patient bed 2. The examination space 1 is essentially cylindrical.

The examination space 1 is surrounded by various magnets and magnet systems. First, there is a basic magnet 4. The basic magnet 4 generates a homogeneous basic magnetic field. A gradient magnet system 5 is also present. Gradient fields, which are required for generating meaningfully interpretable magnetic resonance signals, are generated with the gradient magnet system 5. The magnet system also has a whole-body coil 6. The whole-body coil 6 is fashioned as a radio-frequency antenna 6. Given operation as transmission antenna, it serves for exciting magnetic resonance signals in the examination subject 3. Given operation as reception antenna, it serves for the reception of previously excited magnetic resonance signals of the examination subject 3.

At least one local coil 7 generally also can be introduced into the inside of the examination space 1, which likewise is fashioned as a radio-frequency antenna 7. It usually serves for the local reception of magnetic resonance signals that were previously excited with the whole-body coil 6. On a case-by-case basis, however, the local coil 7 also can be operated as transmission antenna, just like the whole-body coil 6. Except for smaller dimensions, the structure of the local coil 7 can be similar to the structure of the whole-body coil 6. Examples of such local coils are a head coil and a knee coil.

The basic magnet 4, the gradient magnet system 5 and the coils 6, 7 are also surrounded by a shield magnet 8.

The gradient magnet system 5 and the coils 6, 7 are connected to a control and evaluation unit 9. In a known way, this effects the suitable drive of the gradient magnet system 5 and of the coils 6, 7 in order to excite, receive and evaluate magnetic resonance signals.

As shown FIGS. 2 and 3, the radio-frequency antennas, whether in the form of the whole-body coil 6 or in the form of the local coil 7, have a number of antenna rods 10 as well as two end rings 11. Further, capacitors C with which the radio-frequency antenna 6 or 7 is tuned to a specific operating frequency are arranged in the antenna rods 10 and/or the end rings 11. According to FIG. 2, the capacitors C are arranged both in the end rings 11 as well as in the antenna rods 10. As a result, a tuning of the modes of the radio-frequency antenna to the same resonant frequency can be achieved. This, however, is of secondary significance in the framework of the present invention. The capacitors C alternatively could be arranged only in the end rings 11 or only in the antenna rods 10.

The antenna rods 10 proceed parallel to an antenna axis 12. The are arranged uniformly distributed around the antenna axis 12 and have their respective upper and lower rod ends connected to one of the end rings 11. The end rings 11 thus are arranged concentrically to the antenna axis 12 and axially offset from one another.

The radio-frequency antenna 6 or 7 has a coupling element 13 allocated to it. The coupling element 13 is connected to a feed module 14. In the transmission mode, it is possible to feed a high-frequency system of currents into the coupling element from the feed module 14 via the coupling element 13 and to thus couple high-frequency electromagnetic energy into the end rings 11 and the antenna rods 10. In the reception mode, conversely, it is possible to couple high-frequency electromagnetic energy out of the end rings 11 and the antenna rods 10 via the coupling element 13 and to supply this to the feed module 14 as high-frequency system of currents.

The coupling element 13 tangentially surrounds the antenna axis 12 in the region of the antenna rods 10. More specifically, it is fashioned as a conductor system that proceeds circumferentially around the antenna axis 12 either radially inside or outside the antenna rods 10. The conductor system is thereby galvanically separated from the end rings 11 and the antenna rods 10, and is only inductively coupled the antenna rods 10 and/or to end rings 11.

Various embodiments of the conductor system of the coupling element 13 shall now be described below in conjunction with FIGS. 4 through 6.

As shown in FIG. 4, the conductor system 13A has a single conductor 15. The conductor 15 proceeds around the antenna axis 12. Its spacing 'a' from one of the end rings 11 varies with a tangential angle α.

The spacing 'a' assumes a maximum value M and a minimum value m. According to FIG. 4, the difference between maximum value M and minimum value m amounts to 70% of the offset V of the end rings 11 relative to one another. In particular, the difference thus lies between 50% and 90% of the offset V of the end rings 11. As warranted, however, it can be smaller, but should not fall below 30% of the offset V.

It can also be seen from FIG. 4 that the spacing 'a' is essentially sinusoidally dependent on the tangential angle α and that the conductor 15 is symmetrically arranged with reference to a middle plane 16 that intersects the antenna axis 12 perpendicularly in the middle between the two end rings 11.

Dependent on the frequency of the current fed into the conductor 15, or fed out from the conductor 15, and on the overall length of the conductor 15, it may be necessary to arrange shortening capacitors C' in the conductor 15 in order to achieve an approximately constant current occupancy at every location of the conductor 15. Dimensioning and spacing of the shortening capacitors C' are well known.

In the embodiment of the conductor system 13B according to FIG. 5, a basic conductor group is first provided. The basic conductor group has two conductors 17 that proceed around the antenna axis 12. The conductors 17 cross at crossing tangential angles α. The crossing tangential angles α are represented by nodes in FIG. 5. The conductors 17, however, are not electrically connected to one another at the crossing points. The conductors 17 have a spacing 'b' from one another at the crossing points. As a result, the conductors 17 form an even number of windows 18.

In the transmission mode, currents that are electrically phase-offset by 180° relative to one another are supplied into the conductors 17. This is indicated by the two oppositely directed arrows at the conductors 17 in FIG. 5. In the reception mode, the currents supplied from the conductors 17 are electrically phase-offset by 180° degrees relative to one another.

Due to the phase offset of 180°, it is possible to short-circuit the conductors to one another at the end of their run around the antenna axis 12. This is shown at the left in FIG. 5 by means of the direct connection of the two conductors 17 to one another.

The conductors 17 proceed sinusoidally around the middle plane 16. The spacing 'b' of the conductors 17 from one another is thus likewise sinusoidally dependent on the tangential angle α. Further, the conductors 17 are thus symmetrically arranged with respect to the middle plane 16.

The spacing 'b' of the conductors 17 from one another assumes a maximum value M. The minimum value amounts to zero (trivially, since the conductors 17 cross). The maximum value M should not fall below 30% of the offset V of the end rings 11 relative to one another. The maximum value again preferably lies between 50 and 90% of the offset V, for example at 70%.

Just as in the conductor 15 according to FIG. 4, shortening capacitors can be arranged in the conductors 17 if this is required due to the length of the conductors 17 and the frequency of the currents. For clarity, the shortening capacitors are not shown in FIG. 5.

A mutual compensation of the magnetic field components directed parallel to the antenna axis 12 is possible with the conductors 17 of the basic conductor group. The excited modes of the radio-frequency antenna, however, are linearly polarized, whereas circularly polarized magnetic fields are preferred given magnetic resonance applications.

In order to excite the modes circularly polarized, the conductor system 13 of FIG. 5 has an auxiliary conductor group. The auxiliary conductor group is fashioned just like the basic conductor group. In particular, it has two conductors 19 that are laid the same as the conductors 17, however, the conductors 19 are conducted such that the windows 20 that they form are staggered relative to those of the basic conductor group.

The currents flowing in the conductors 19—fed into the conductors 19 in the transmission mode, fed out from the conductors 19 in the reception mode—are electrically phase-offset by 180° relative to one another. This is indicated in FIG. 5 by the oppositely directed arrows at the conductors 19. However, the currents flowing in the conductors 19 are electrically phase-offset by 90° compared to the currents flowing in the conductors 17. This is indicated in FIG. 5 by the arrows at the conductors 19 pointing up or down, in contrast to which the arrows at the conductors 17 point toward the left or right.

Just like the conductors 17, the conductors 19 can also be short-circuited with one another at the end of their path to the antenna axis 12. Due to the fact that the connections of the conductors 17 and 19 can ensue at different tangential angles α, connections that may be different from one another can be employed. However, it is also possible to short all four conductors 17, 19 to one another when the end of the path around the antenna axis 12 lies at the same tangential angle α.

In the latter case, the two conductor groups with the conductors 17, 19 can also be considered as a number of conductors that, except for an offset angle β, proceed identically periodically around the antenna axis 12. The offset angle β is defined by requiring that the product of the offset angle β with the number of conductors 17, 19 (here: four) and the number of periods of a conductor 17, 19 (here: two) yield 360°. The offset angle β according to FIG. 5 thus amounts to 45°. The currents fed into or fed out from the conductors 17, 19 are electrically phase-offset respectively by 90° relative to one another.

In the embodiment according to FIG. 5, the magnetic field of the conductor system 13B has essentially no component parallel to the antenna axis 12 and is circularly polarized, but it requires a total of four conductors 17, 19.

A circularly polarized magnetic field can likewise be generated with the embodiment according to FIG. 6. This embodiment, however, requires only three conductors 21. The conductor system 13C according to FIG. 6 essentially corresponds to that of FIG. 5, but with the difference that the offset angle β according to FIG. 6 amounts to 60° (60°×2 periods×3 conductors=360°) and the currents fed into or out from the conductors 21 are electrically phase offset by 120° (360°:3 conductors) relative to one another. The rest of the design of the conductor system 13C according to FIG. 6 corresponds to that of FIG. 5. The electrical phase offset is indicated in FIG. 6 by the individual current phases in FIG. 6 being entered in the pointer diagram at the conductors 21. The conductors 21 are also short-circuited with one another at the end of their path around the antenna axis 12.

A good, efficient and mode-defined coupling of the feed module 14 to the end rings 11 and the antenna rods 10 is possible by means of the inventive coupling elements 13—particularly given the fashioning according to FIGS. 5 and 6. Given a corresponding design of the conductor system 13B or 13C, it is even possible to achieve a mode-pure infeed or outfeed. Due to the interaction of the coupling element 13 not only with the antenna rods 10 but also with the end rings 11, it may be required for a coupling with only a single mode that the sine deflection of the conductors 15, 17, 19, 21 be slightly reduced in the region of their maximum values.

It is also possible to provide a number of coupling elements 13 that, for example, differ in terms of the number of periods and/or the rotational sense of the magnetic fields they generate. By means of an appropriate infeed or outfeed, a designational selection then can be made regarding which mode is coupled in or out, or which modes are coupled in or out.

Although modifications and changes may be suggested by those skilled in the art, it is the intention of the inventors to embody within the patent warranted hereon all changes and modifications as reasonably and properly come within the scope of their contribution to the art.

We claim as our invention:

1. A radio-frequency antenna system of a magnetic resonance apparatus comprising:
    a radio-frequency antenna having two end rings spaced from each other along an antenna axis and each being disposed concentrically to said antenna axis and a plurality of antenna rods disposed around said antenna axis and connecting said end rings to each other;
    a feed module;
    a coupling element between said feed module and said radio frequency antenna;
    said feed module being connected to said coupling element and supplying at least one radio-frequency input current to said coupling element in a transmission mode and receiving at least one radio-frequency output current from said coupling element in a reception mode; and said coupling element consisting of a conductor system proceeding circumferentially around said antenna axis radially spaced from said antenna rods, and disposed between said end rings, said coupling element being only inductively coupled to said end rings and to said antenna rods in said transmission mode, wherein electromagnetic energy is coupled from said feed module into said end rings and into said antenna rods and, in said reception mode, wherein radio-frequency electromagnetic energy is coupled out of said end rings and out of said antenna rods into said feed module.

2. A radio-frequency antenna system as claimed in claim 1 wherein said antenna rods are disposed parallel to said antenna axis.

3. A radio-frequency antenna system as claimed in claim 1 wherein said conductor system comprises a single conductor proceeding in a circumferential path around said antenna axis, and having an axial spacing from one of said end rings that varies along said circumferential path.

4. A radio-frequency antenna system as claimed in claim 3 wherein said single conductor is disposed symmetrically relative to a middle plane that perpendicularly intersects said antenna axis midway between said end rings.

5. A radio-frequency antenna system as claimed in claim 3 further comprising shortening capacitors connected in said single conductor.

6. A radio-frequency antenna system as claimed in claim 3 wherein said spacing varies substantially sinusoidally.

7. A radio-frequency antenna system as claimed in claim 3 wherein said spacing has a maximum value and a minimum value with a difference between said maximum value and said minimum value being at least 30% of a spacing between said end rings.

8. A radio-frequency antenna system as claimed in claim 7 wherein said difference is in a range between 50% and 90% of said spacing between said end rings.

9. A radio-frequency antenna system as claimed in claim 1 wherein said antenna system comprises a first conductor and at least two second conductors, said first conductor proceeding circumferentially around said antenna axis along a first conductor path and said second conductors proceeding circumferentially around said antenna axis along respective, different second conductor paths, each of said second conductors having an axial spacing from said one of said end rings that varies in the respective second circumferential paths, and wherein said first circumferential path and said second circumferential paths have equal dependency on circumferential position but are offset relative to each other by a circumferential offset angle, with a product of the circumferential offset angle and a total number of said first conductor and said second conductors and a plurality of periods of said first conductor being 360°, and wherein said feed module feeds respective radio-frequency input currents to said first conductor and said second conductors in said transmission mode that are phase-offset with respect to each other by a phase-offset, and wherein said feed module receives respective radio-frequency output currents from said first conductor and said second conductors in said reception mode that are phase-offset relative to each other by a phase-offset, and wherein a product of the respective phase-offsets and a total number of said first conductor and said second conductors is 360°.

10. A radio-frequency antenna system as claimed in claim 1 wherein said conductor system comprises a first conductor and a second conductor proceeding around said antenna axis respectively along first and second circumferential paths, said second conductor crossing said first conductor at an even number of crossing points in said first and second circumferential paths, and being axially spaced from said first conductor between said crossing points, and wherein said feed module feeds respective radio-frequency input currents to said first conductor and said second conductor in said transmission mode that are phase-offset by 180° relative to each other, and wherein said feed module receives respective radio-frequency output currents from said first conductor and said second conductor in said reception mode that are phase offset by 180° relative to each other.

11. A radio-frequency antenna system as claimed in claim 10 wherein said first and second conductors are short-circuited with each other at the respective ends of the respective first and second circumferential paths.

12. A radio-frequency antenna system as claimed in claim 10 wherein said first and second conductors are disposed symmetrically relative to a middle plane that perpendicularly intersects said antenna axis midway between said end rings.

13. A radio-frequency antenna system as claimed in claim 10 further comprising shortening capacitors connected in said first and second conductors.

14. A radio-frequency antenna system as claimed in claim 10 wherein said spacing between said first and second conductors varies substantially sinusoidally.

15. A radio-frequency antenna system as claimed in claim 10 wherein said spacing between said first and second conductors has a maximum value and a minimum value with a difference between said maximum value and said minimum value being at least 30% of a spacing between said end rings.

16. A radio-frequency antenna system as claimed in claim 15 wherein said difference is in a range between 50% and 90% of said spacing between said end rings.

17. A radio-frequency antenna system as claimed in claim 10 wherein said crossing points are first crossing points, and wherein said conductor system comprises a third conductor and a fourth conductor respectively proceeding around said antenna axis along third and fourth circumferential paths, said fourth conductor crossing said third conductor at an even number of second crossing points in said third and fourth circumferential paths, and being axially spaced from said third conductor between said second crossing points, and wherein said feed module feeds respective radio-frequency input currents to said third conductor and said fourth conductor in said transmission mode that are phase-offset by 180° relative to each other, and wherein said feed module receives respective radio-frequency output currents from said third conductor and said fourth conductor in said reception mode that are phase-offset by 180° relative to each other, and wherein said second crossing points are staggered relative to said first crossing points, and wherein the currents in said third and fourth conductors are phase-offset by 90° with respect to the currents in said first and second conductors.

18. A radio-frequency antenna system as claimed in claim 17 wherein said first, second, third and fourth conductors are short-circuited with each other at respective ends of the respective first, second, third and fourth circumferential paths.

19. A radio-frequency antenna system as claimed in claim 18 wherein said first and said second conductors are short-circuited with each other at respective ends of respective paths of said conductors around said antenna axis.

20. A radio-frequency antenna system as claimed in claim 18 wherein said first and said second conductors are disposed symmetrically relative to a middle plane that perpendicularly intersects said antenna axis midway between said end rings.

21. A radio-frequency antenna system as claimed in claim 18 further comprising shortening capacitors connected in said first and said second conductors.

22. A radio-frequency antenna system as claimed in claim 18 wherein said respective spacings vary substantially sinusoidally.

23. A radio-frequency antenna system as claimed in claim 22 wherein said respective spacings have a maximum value and a minimum value with a difference between said maximum value and said minimum value being at least 30% of a spacing between said end rings.

24. A radio-frequency antenna system as claimed in claim 23 wherein said difference is in a range between 50% and 90% of said spacing between said end rings.

* * * * *